United States Patent
Adenau (10) Patent No.: US 10,595,386 B2
(45) Date of Patent: Mar. 17, 2020

(54) LIGHTING CONTROL CONSOLE HAVING A DUAL ENCODER

(71) Applicant: MA LIGHTING TECHNOLOGY GMBH, Waldbüttelbrunn (DE)

(72) Inventor: Michael Adenau, Würzburg (DE)

(73) Assignee: MA LIGHTING TECHNOLOGY GMBH, Waldbuttelbrunn (DE)

(*) Notice: Subject to any disclaimer, the term of this patent is extended or adjusted under 35 U.S.C. 154(b) by 0 days.

(21) Appl. No.: 16/478,060

(22) PCT Filed: Dec. 13, 2017

(86) PCT No.: PCT/EP2017/082633
§ 371 (c)(1),
(2) Date: Jul. 15, 2019

(87) PCT Pub. No.: WO2018/134000
PCT Pub. Date: Jul. 26, 2018

(65) Prior Publication Data
US 2019/0357336 A1    Nov. 21, 2019

(30) Foreign Application Priority Data
Jan. 18, 2017    (DE) .................... 20 2017 100 249 U (51) Int. Cl.
*H05B 41/00* (2006.01)
*H05B 37/02* (2006.01)
(Continued)

(52) U.S. Cl.
CPC ......... *H05B 37/029* (2013.01); *G06F 1/1616* (2013.01); *G06F 1/1681* (2013.01);
(Continued)

(58) Field of Classification Search
CPC .. H05B 41/28; H05B 41/295; H05B 41/2827; H05B 41/3925; H05B 33/0815;
(Continued)

(56) References Cited

U.S. PATENT DOCUMENTS 5,187,630 A * 2/1993 MacKay ................. G05G 1/08
                                                                     200/565
5,404,152 A    4/1995 Nagai
(Continued)

FOREIGN PATENT DOCUMENTS

CN    104081162 A    10/2014
DE    102014116827 A1    5/2016
(Continued)

OTHER PUBLICATIONS

PCT International Search Report, PCT/EP2017/082633, dated May 16, 2018, 3 pages.
(Continued)

*Primary Examiner* — Minh D A
(74) *Attorney, Agent, or Firm* — Quarles & Brady LLP (57) ABSTRACT

A lighting control console for controlling a lighting system includes at least one digital processor, at least one digital memory, and at least one display device configured to graphically depict graphic elements for users. At least one dual encoder is provided in the control panel, which allows users to enter input values. The dual encoder presents a first shaft rotatably mounted in a housing with a first rotation signal generator and a second shaft mounted in the housing so as to be coaxially rotatable at the dual encoder. Both shafts include actuating elements transmitting adjusting movements onto the shafts. The actuating elements are embodied in a rotary disk and/or of a rotary swivel disposed in the control panel of the lighting control console and configured to be coaxially turned in opposite directions.

11 Claims, 7 Drawing Sheets

(51) Int. Cl.
*G06F 1/16* (2006.01)
*G06F 3/0362* (2013.01)
*G06F 3/0484* (2013.01)
*G05G 1/08* (2006.01)
*G05G 1/02* (2006.01)
*G05G 5/12* (2006.01)
*G05G 13/00* (2006.01)
*G06F 3/0482* (2013.01)

(52) U.S. Cl.
CPC ....... *G06F 3/0362* (2013.01); *H05B 37/0209* (2013.01); *G05G 1/02* (2013.01); *G05G 1/08* (2013.01); *G05G 5/12* (2013.01); *G05G 13/00* (2013.01); *G05G 2505/00* (2013.01); *G06F 3/0482* (2013.01); *G06F 3/04847* (2013.01)

(58) Field of Classification Search
CPC ............ H05B 33/0818; H05B 41/2828; H05B 41/3921; H05B 41/3927; H05B 37/029; H05B 33/0803; H05B 37/0254; H05B 37/02; Y02B 20/202; F21W 2131/406; F21V 11/10
See application file for complete search history.

(56) References Cited

U.S. PATENT DOCUMENTS

| | | |
|---|---|---|
| 8,138,689 B2 | 3/2012 | Adenau |
| 10,149,373 B2 | 12/2018 | Adenau |
| 2004/0210916 A1 | 10/2004 | Hori |
| 2009/0079712 A1* | 3/2009 | Levin .................... G05G 9/047 345/184 |
| 2010/0238200 A1 | 9/2010 | Adenau |
| 2012/0186951 A1 | 7/2012 | Wu et al. |
| 2015/0084435 A1 | 3/2015 | Lammel et al. |
| 2016/0138943 A1 | 5/2016 | Jordens et al. |
| 2016/0143118 A1 | 5/2016 | Adenau |
| 2018/0113608 A1 | 4/2018 | Adenau et al. |

FOREIGN PATENT DOCUMENTS

| | | |
|---|---|---|
| DE | 202016105915 U1 | 11/2016 |
| EP | 0752632 A2 | 1/1997 |
| EP | 1544880 A2 | 6/2005 |
| WO | 9423273 A1 | 10/1994 |

OTHER PUBLICATIONS

European Patent Office, Search Report, Application No. EP 17 20 3554, dated May 15, 2018, 2 pages.

PCT English Language Translation of the International Preliminary Report on Patentability, PCT/EP2017/082633, dated Aug. 1, 2019, 11 pages.

China National Intellectual Property Administration, First Office Action and Search Report, Application No. 201780005156.0, Nov. 27, 2019, 15 pages.

* cited by examiner

LIGHTING CONTROL CONSOLE HAVING A DUAL ENCODER

CROSS-REFERENCE TO RELATED APPLICATIONS

This application represents the national stage entry of PCT International Application No. PCT/EP2017/082633 filed Dec. 13, 2017, which claims priority of German Patent Application No. 20 2017 100 249.7, filed Jan. 18, 2017, the disclosures of which are incorporated by reference here in their entirety for all purposes.

BACKGROUND

The disclosure relates to a lighting control console having a dual encoder according to the preamble of claim 1. Further, the disclosure relates to a method for operating a lighting control console in accordance with the disclosure.

Generic lighting control consoles serve for controlling lighting systems such as those employed in theaters or on concert stages, for instance. Routinely, said lighting systems comprise a plurality of lighting devices, for instance stage spotlights, wherein, in the lighting systems on their own, it is in many cases also possible to switch between a plurality of lighting states, for instance between different colors. These different lighting states are stored and controlled in the lighting program of the lighting control console by way of programmed parameters. Here, standard lighting systems may comprise up to several thousand lighting devices. In order to be able to control such complex lighting systems, the generic lighting control consoles are equipped with a digital processor, which permits digital data and signal processing. For storing the data, a digital memory is further provided, which digital memory in particular allows for archiving of lighting programs.

For programming the lighting program or for controlling the lighting program while it is running, operators have to enter control commands as input values. Said control commands can, for instance, be the selection of a specific lighting device or the setting of a specific parameter. For entering these control commands, mechanical control elements, for instance key buttons, rotary controls or slide controls, are available at known lighting control consoles. Here, the control commands being assigned to the individual control elements may be altered by way of suitable menu changeovers in order to be able to program and control correspondingly complex lighting programs.

Dual encoders are input apparatuses, which allow users to enter an assigned electrical signal by turning an actuating element. Here, dual encoders are characterized in that they do not only include one actuating element, for instance a rotary knob or a rotary disk, but two actuating elements. Both actuating elements are connected to a shaft being mounted so as to be rotatable. One rotation signal generator, which is able to directly or indirectly detect a turning of the shaft, is assigned to each shaft. In each instance, the two rotation signal generators then generate an assigned electrical signal after having detected an adjusting movement at the shaft.

In known dual encoders, the control elements are embodied in the manner of rotary knobs so that the corresponding rotary knob has to be adjusted between the thumb and the index finger for entering a parameter at the dual encoder. In other words, this means that in known dual encoders, entering a new value requires turning the assigned rotary knob at the dual encoder between the thumb and the index finger.

These dual encoders having a rotary knob have the disadvantage that the level of ease of operation for the operators is relatively low. Besides, it is not possible to enter new values simultaneously at both actuating elements of the dual encoder by turning the actuating elements since the corresponding operating hand only comprises one thumb.

SUMMARY

Starting from this state of the art, it is therefore the object of the present disclosure to propose a novel lighting control console having a dual encoder whose actuating elements, at which the dual encoder is adjusted, allow for a higher level of ease of operation.

Advantageous embodiments of the disclosure are the subject-matter of the dependent claims.

The lighting control console in accordance with the disclosure, in the control panel, is equipped with at least one dual encoder for entering input values. The disclosure is initially based on the fundamental idea that the actuating elements, for hand-actuated adjustment of the two shafts of the dual encoder, are embodied in the manner of a rotary disk or of a rotary swivel. By replacing the usual rotary knobs at dual encoders as well as by employing rotary disks or rotary swivels in accordance with the disclosure, the ease of operation when entering input parameters is considerably enhanced. This is because a rotary disk or a rotary swivel, due to the higher leverages, permits turning the shaft of the dual encoder by actuating it with only one finger. It is not necessary to grasp the rotary knob as with the known dual encoders. As a result, the operators are thus able, by touching the two rotary disks or the two rotary swivels of the dual encoder in accordance with the disclosure with two separate fingers, to realize two input parameters simultaneously by adjusting the two rotary disks or the two rotary swivels correspondingly. Thus, in addition, the entering speed can correspondingly be accelerated since two input values can simultaneously be entered with one hand at the dual encoder of the lighting control console in accordance with the disclosure.

With regard to a high resistance to wear, it is advantageous if a first locking mechanism, for locking different rotational positions of the first shaft, is provided at the first shaft, wherein the first rotation signal generator is provided for generating a data signal showing a switchover between two locking positions. Furthermore, a second locking mechanism for locking different rotational positions of the second shaft is provided at the second shaft, wherein the second rotation signal generator is provided for generating a data signal showing a switchover between two locking positions.

In order to further enhance the ease of operation when entering input parameters at the dual encoder of the lighting control console in accordance with the disclosure, it is envisaged in accordance with a preferred embodiment that the upper side of the rotary disk or of the rotary swivel is embodied in the manner of a fingertip contact surface. This makes it possible that the rotary disk or the rotary swivel can rotationally be driven by way of the engagement of a fingertip at the fingertip contact surface.

In order to allow for an improved gripping contact between the fingertip contact surface and the fingertip that is envisaged for engagement, it is furthermore particularly advantageous if the fingertip contact surface is concave. By way of the concavity, the shape of the fingertip contact surface can at least in some sections match the convex outside of the fingertip so that a secure grip of the fingertip on the fingertip contact surface is given due to the enlarged contact surface.

In order to provide the users with as much freedom of movement as possible when engaging the fingertip on the fingertip contact surface, it is particularly advantageous if the fingertip contact surface presents an annular shape. As an alternative, the fingertip contact surface can also present a circular shape. Within the annular or circular fingertip contact surface, the users can then position their fingertips relatively freely and achieve a reliable contact with the fingertip contact surface in each case.

In order to be able to adjust the two rotary disks or the two rotary swivels simultaneously with two fingers or the one rotary disk with the assigned rotary swivel of the encoder simultaneously, it is particularly advantageous if the two rotary disks or rotary swivels, with the aid of which the two shafts of the dual encoder are driven, are disposed on the same level in relation to the outside of the housing. By correspondingly approaching the two fingertip contact surfaces, which thus run on the same level, with the fingers from the top, a simultaneous adjustment of the two actuating elements of the dual encoder can then be realized, the ergonomics being very good.

For specific functions when employing the lighting control console in accordance with the disclosure, it is advantageous that, after setting at least one of the two shafts of the dual encoder, for instance for selecting an X or a Y value, users can select and confirm the corresponding value. Said selection and confirmation of a value having been set at the shaft can in a simple manner be realized in that at least one of the two shafts is mounted so as to be axially adjustable in the direction of its longitudinal axis between a rest position and a switched position. Hence, this means that the shaft is not only mounted so as to be rotatable, but also so as to be axially adjustable. In order to realize the selection and confirmation of a set value, a switching sensor is additionally provided in the housing, with the aid of which sensor the adjustment of the axially adjustable shaft between the rest position and the switched position can be detected. If the users have now set a specific value by turning the shaft, which can be analyzed electronically by evaluating the signals of the rotation signal generator, the users can then push the axially adjustable shaft for a short time and can thereby move it from its rest position into the switched position. This adjustment can then be detected with the aid of the switching sensor, such that the value having been set at the shaft is thus selected and confirmed by the users and can be made available for further electronic processing.

As an alternative or in addition to disposing the switching sensor at the adjustable shaft of the dual encoder, a push button can also be disposed directly next to the rotary disk and/or to the rotary swivel. In the housing, a switching sensor is then assigned to said push button, with the aid of which sensor the rest position and/or the switched position of the push button can be detected. In other words, a corresponding value can hence be selected or confirmed by pushing the push button. It is also conceivable to realize a switchover of functions within the meaning of a shift key by evaluating the switching sensor. For which functions of the inventive lighting control console the dual encoder is employed is basically arbitrary. Since the dual encoder of the inventive lighting control console permits simultaneously entering input parameters with two fingers at both rotary disks or rotary swivels, certain input procedures can particularly be simplified.

In the simplest configuration, the entire lighting control console can be installed in a housing. As an alternative, it is also conceivable that the lighting control console comprises at least two housings that can be linked to each other with the aid of a data interface. The data interface can, for instance, be a USB interface so that the data are transmitted between the housings via a connection cable. As an alternative, wireless data interfaces are also conceivable, such as a WLAN interface. At the first housing, the dual encoder is provided. The remaining operating elements, which serve for programming the lighting program, such as rotary controls, key buttons etc., can also be installed in the first housing. The second housing comprises the digital processor and at least one digital memory for generating, managing and storing adjusting commands.

Besides, the second housing or a third housing, which is connected to the second housing with the aid of a connection cable, can then comprise the display device at which graphic elements are graphically depicted for the users.

If the second housing is embodied in the manner of a laptop or of a personal computer, such a standard appliance can be used for realizing a complete lighting control console by way of coupling to the first housing, which contains the dual encoder and the remaining operating elements, which serve for programming the lighting program.

In accordance with a first inventive method variant, it is envisaged that the actuating element is initially adjusted at the first shaft. Subsequently, the data signal is evaluated at the first rotation signal generator. The initial value of the rotation signal generator that has been determined in this way is then utilized for horizontally adjusting a cursor that is displayed at the display device.

Following this, the actuating element is adjusted at the second shaft and the data signal is evaluated at the second rotation signal generator. The initial value of the second rotation signal generator that has been determined in this way is then used for vertically adjusting the cursor at the display device. By simultaneously adjusting the two actuating elements at the dual encoder, the cursor can hence simultaneously be adjusted vertically and horizontally by the users.

For adjusting the cursor horizontally or vertically, there is a plurality of different cases of application at the inventive lighting control console. In accordance with a preferred method variant, it is envisaged that the horizontal and vertical adjustment of the cursor can be used in order to pass through the columns and rows of a table or the columns and rows of an options menu. In other words, this means that the cursor can successively or also simultaneously be moved through the columns and rows of a table or through the columns and rows of an options menu by adjusting the two actuating elements of the dual encoder at the inventive lighting control console.

In accordance with an alternative method variant, it is envisaged that the evaluation signal of the first rotation signal generator is used for the coarse setting of an operating parameter of the lighting control console and the output signal of the second rotation signal generator is used for the fine tuning of the operating parameter that has coarsely been set before. In this manner, the users can very easily and very fast realize an initial coarse setting of the operating parameter and a subsequent fine tuning of the operating parameter by actuating the two actuating elements of the dual encoder.

If a coarse setting and a fine tuning is realized by way of the inventive method, it is furthermore particularly advantageous if, by actuating a switching sensor, an ultra coarse setting or an ultra fine tuning of the respective operating parameter can be effected as a function of the evaluation of the first or second rotation signal generator. By pushing, for instance, a push button next to the dual encoder, a further switchover can thus be effected so that the operating parameter can be entered even faster and even more precisely by the users. In accordance with a further inventive method variant, it is envisaged that a first color light parameter of a lighting device is set by evaluating the initial signal of the first rotation signal generator. Subsequently or simultaneously, a second color light parameter of the same lighting device can be set by evaluating the data signal of the second rotation signal generator so that the users can in this manner enter, for instance, the light color and/or the light intensity and/or the light temperature of a lighting device largely simultaneously by actuating the two actuating elements.

In accordance with a further inventive method variant, it is envisaged that, by evaluating the data signals of the first rotation signal generator, a first movement parameter of a lighting device can be set and that a second movement parameter of the same lighting device can then be set by evaluating the data signal of the second rotation signal generator.

In this manner, it is, for instance, very easy to enter the pan setting and the tilt setting of a lighting device that is mounted so as to be adjustable in two movement axes by using the dual encoder at the inventive lighting control console.

In accordance with a further inventive method variant, the evaluation of the data signal of the first rotation signal generator can be used for setting a first time measuring parameter, for instance for setting the minutes. By evaluating the data signal at the second rotation signal generator, a second time measuring parameter, for instance the seconds, can then be set.

BRIEF DESCRIPTION OF THE DRAWINGS

In the drawing, one embodiment of the disclosure is schematically illustrated and will be explained by way of example in the following.

In the figures.

DETAILED DESCRIPTION

Figure 1:
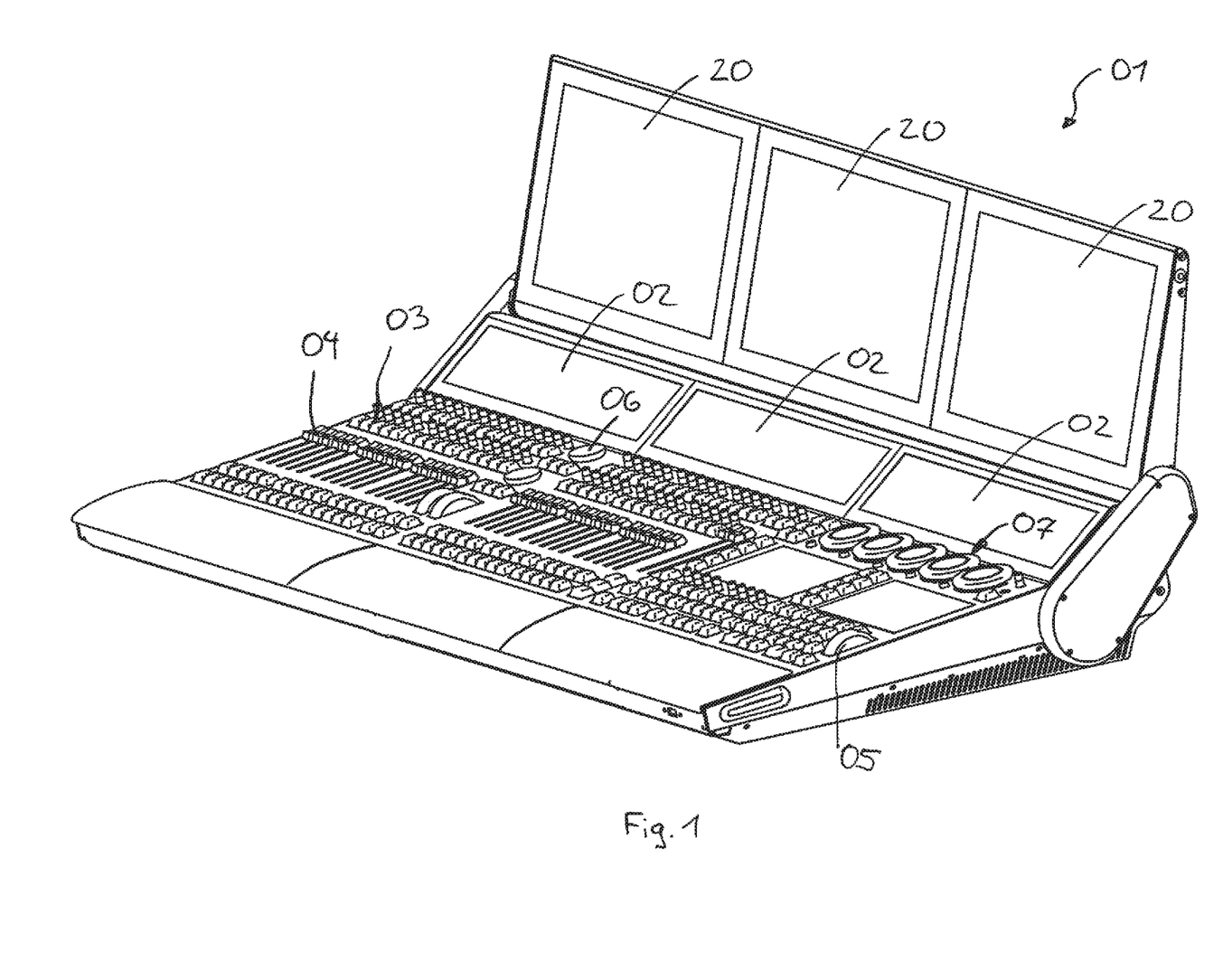
FIG. 1 shows a lighting control console having multiple dual encoders in a perspective view from above.

In a perspective view, FIG. 1 shows a lighting control console 01 in accordance with the disclosure for programming and controlling a stage lighting system. The lighting control console 01 is equipped with three monitors 02 and with three further monitors 20 for displaying various menus for users. For entering adjusting commands, a plurality of push buttons 03, slide controls 04 and adjusting wheels 05 is provided at the lighting control console 01. Besides, for entering control commands, the control panel 08 of the lighting control console 01 is fitted with two simple rotary shaft encoders 06 and five dual encoders 07.

Figure 2:
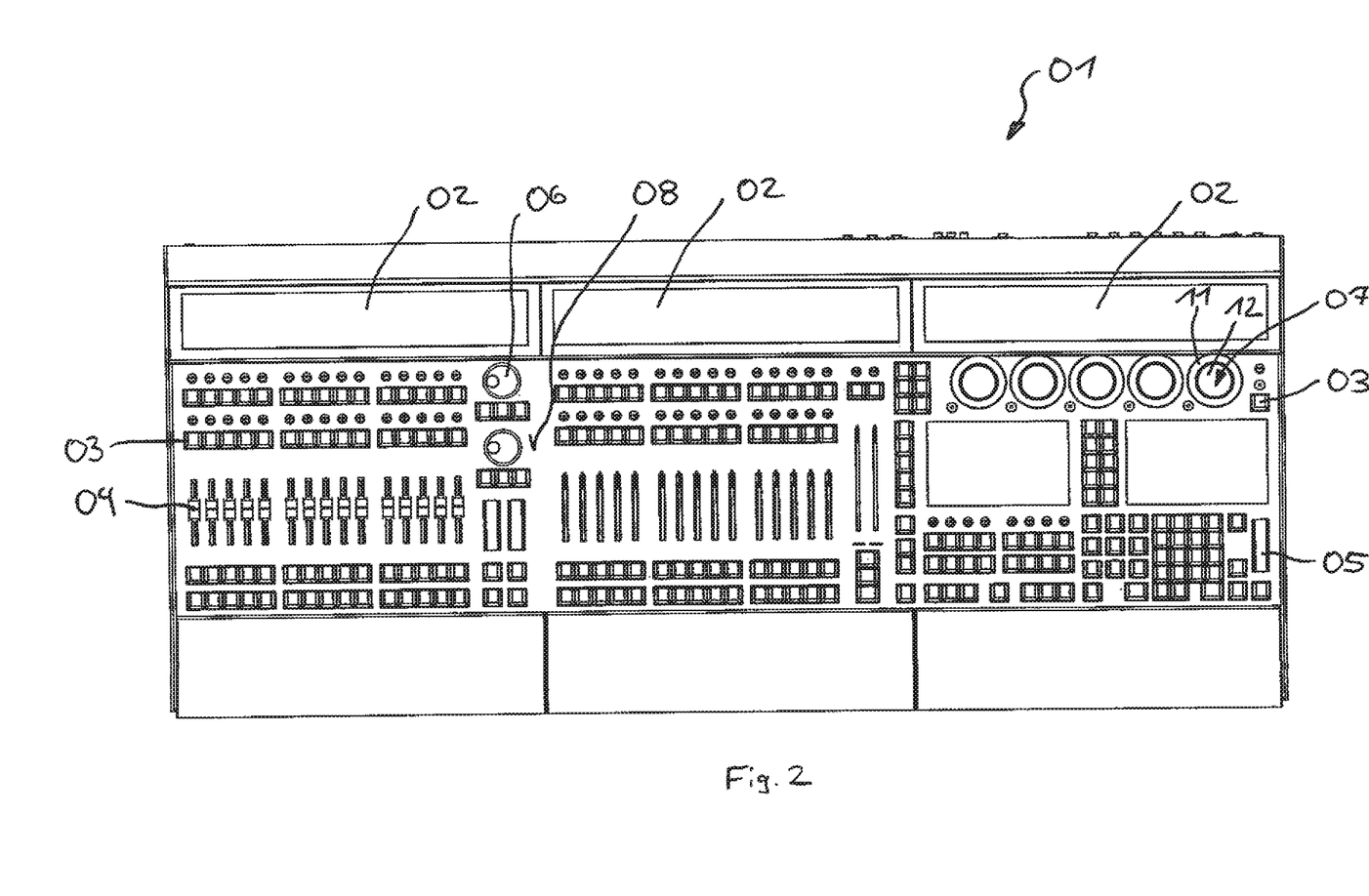
FIG. 2 shows the lighting control console in accordance with FIG. 1 in a view from above.

FIG. 2 shows the lighting control console in accordance with FIG. 1 in a view from above.

Figure 3:
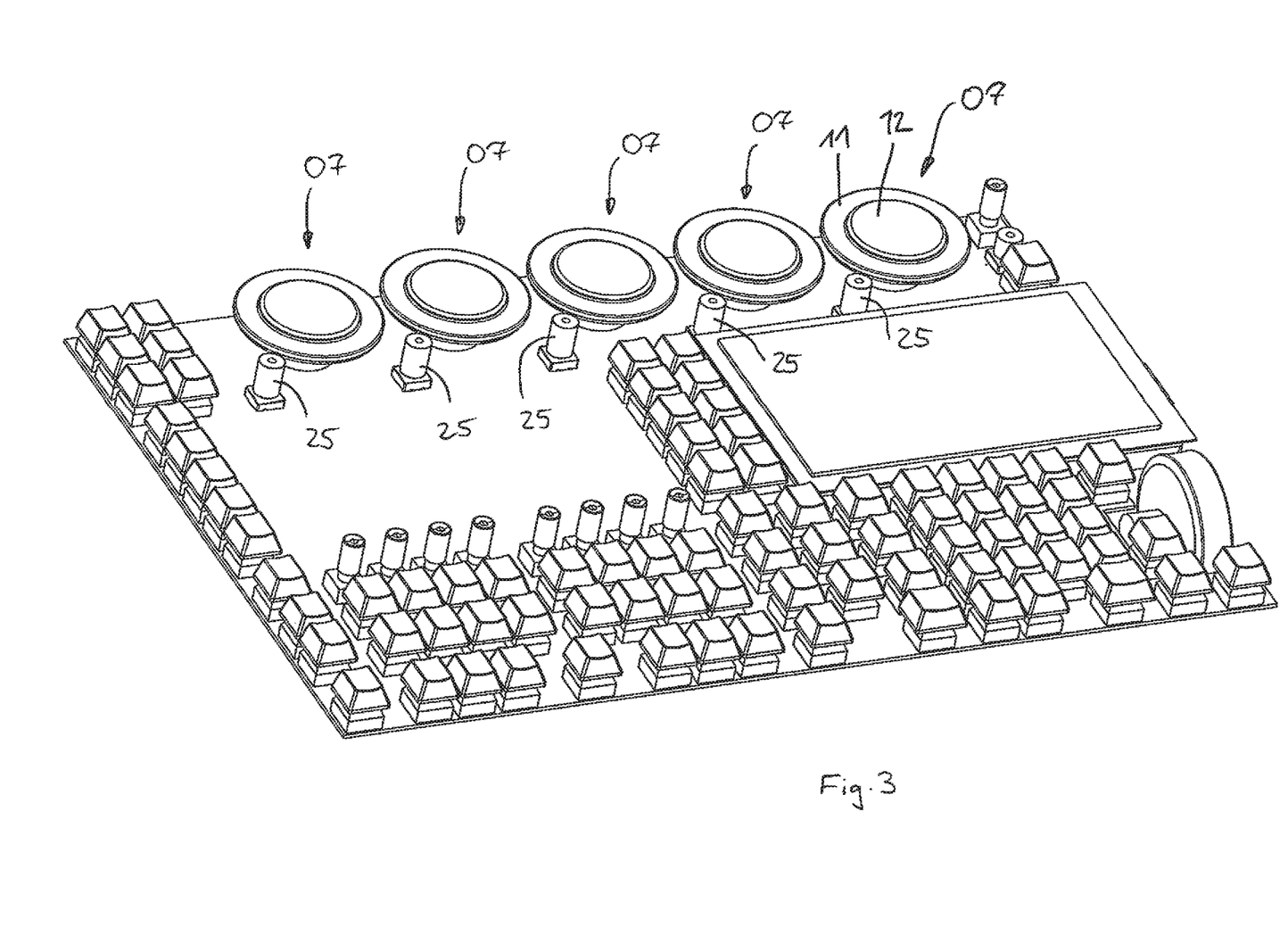
FIG. 3 shows an electronic circuit board of the lighting control console in accordance with FIG. 1 on which the dual encoders are mounted, in a perspective view from above.

FIG. 3 shows an electronic circuit board of the lighting control console 01 on which the dual encoders 07 are mounted, in a perspective view from above. The dual encoders 07 that are installed in the control panel 08 of the lighting control console 01 in each case present two shafts that are mounted so as to be rotatable, namely a hollow shaft 09 and a central shaft 10 that is mounted therein so as to be coaxially rotatable (see FIG. 4). At the upper end of the hollow shaft 09 and of the central shaft 10, two actuating elements that can be adjusted independently from each other, namely a rotary swivel 11 and a rotary disk 12 are fastened. With the aid of the rotary swivel 11, the hollow shaft 09 can be adjusted. With the aid of the rotary disk 12, the central shaft 10 can be turned.

By way of manual actuation of the rotary disk 12 or of the rotary swivel 11, the hollow shaft 09 and the central shaft 10 can hence independently from each other be turned rotationally about their longitudinal axis in order to thereby enter adjusting commands into the lighting control console. Here, the hollow shaft 09 is additionally mounted so as to be axially adjustable in the direction of the longitudinal axis 12 so that the users can select and confirm, by pressing onto the upper side 14 (see FIG. 5) of the rotary disk 12, a value that has been set by turning the hollow shaft 09. Next to each dual encoder 07, a push button 25 is disposed, with the aid of which the functionalities of the dual encoder 07 within the meaning of a shift key can be switched over.

Figure 4:
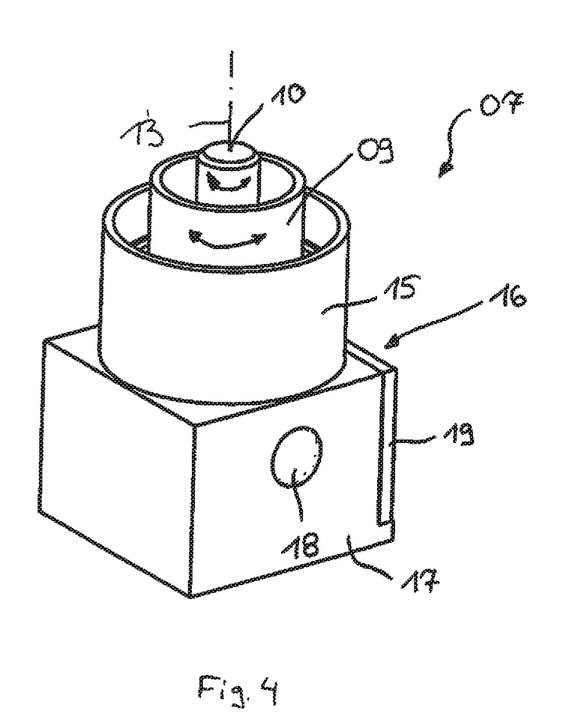
FIG. 4 shows a dual encoder of the lighting control console in accordance with FIG. 1 in a perspective lateral view.

FIG. 4 shows the lower part of the dual encoder 07 having the shafts 09 and 10 that are mounted so as to be rotatable, in a perspective lateral view. The hollow shaft 09 is mounted in the cylindrical upper part 15 of the housing 16 so as to be rotatable. The central shaft 10 is mounted in the hollow shaft 09 so as to be rotatable. A rectangular lower part 17 is attached to the upper part 15 of the housing 16, said rectangular lower part 17 serving for fastening the dual encoder 07 in the housing of the lighting control console 01.

Figure 5:
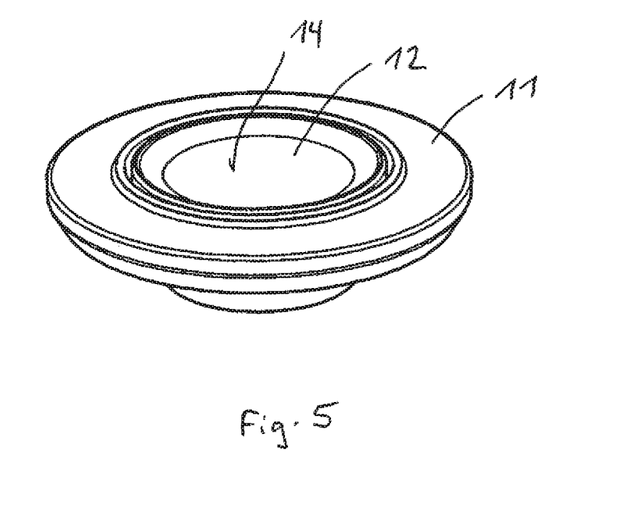
FIG. 5 shows the two actuating elements of the dual encoder in accordance with FIG. 4 in a perspective view from above.

FIG. 5 shows the two actuating elements of the dual encoder 07, namely the rotary swivel 11 and the rotary disk 12, in a perspective lateral view.

Figure 6:
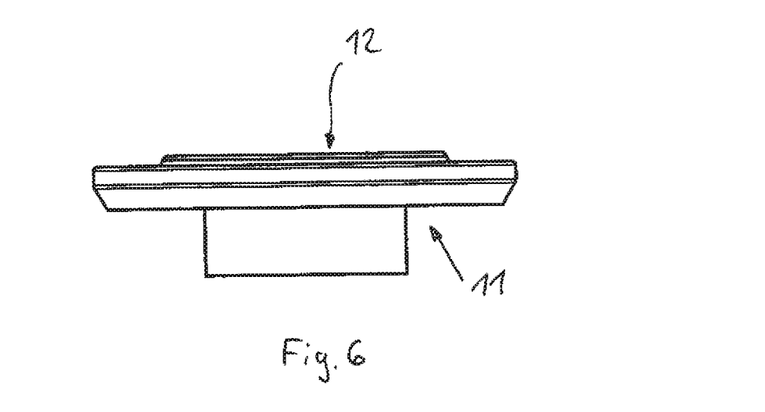
FIG. 6 shows the actuating elements in accordance with FIG. 5 in a lateral view.

FIG. 6 shows the rotary swivel 11 and the rotary disk 12 in a lateral view.

Figure 7:
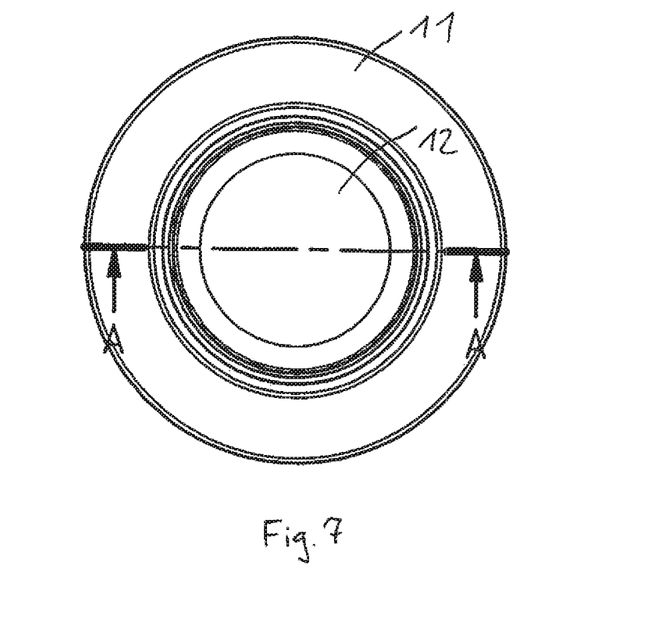
FIG. 7 shows the actuating elements in accordance with FIG. 5 in a view from above.

FIG. 7 shows the rotary swivel 11 and the rotary disk 12 in a view from above.

Figure 8:
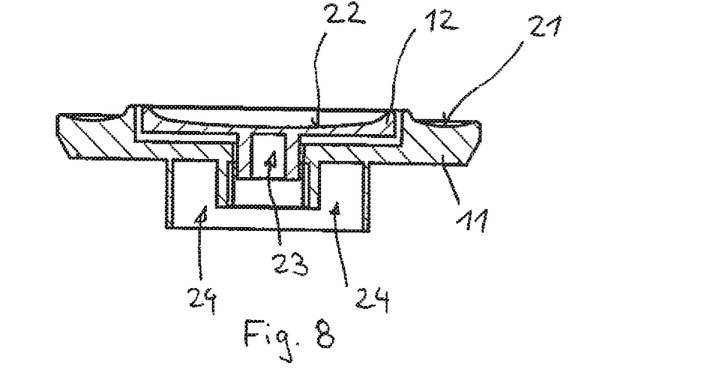
FIG. 8 shows the actuating elements in accordance with FIG. 7 in a cross-section along the sectional line A-A.

FIG. 8 shows the rotary swivel 11 and the rotary disk 12 in a cross-section. At the upper side of the rotary swivel 11 and of the rotary disk 12, concave fingertip contact surfaces 21 or 22 are in each case provided, at which a finger of the users can in each case be engaged with the fingertip in order to be able to simultaneously adjust both actuating elements of the dual encoder 07 with the two fingers. Here, fingertip contact surface 21 is designed so as to have an annular shape, whereas fingertip contact surface 22 presents a circular shape. The central shaft 10 is plugged into the clearance 23 of the rotary disk 12 from below. The hollow shaft 09 is plugged into the clearance 24 of the rotary swivel 11 from below. Both fingertip contact surfaces 21 and 22 of the two actuating elements of the dual encoder 07 are located on the same level, permitting an ergonomic actuation of the dual encoder 07 with two fingers.

Figure 9:
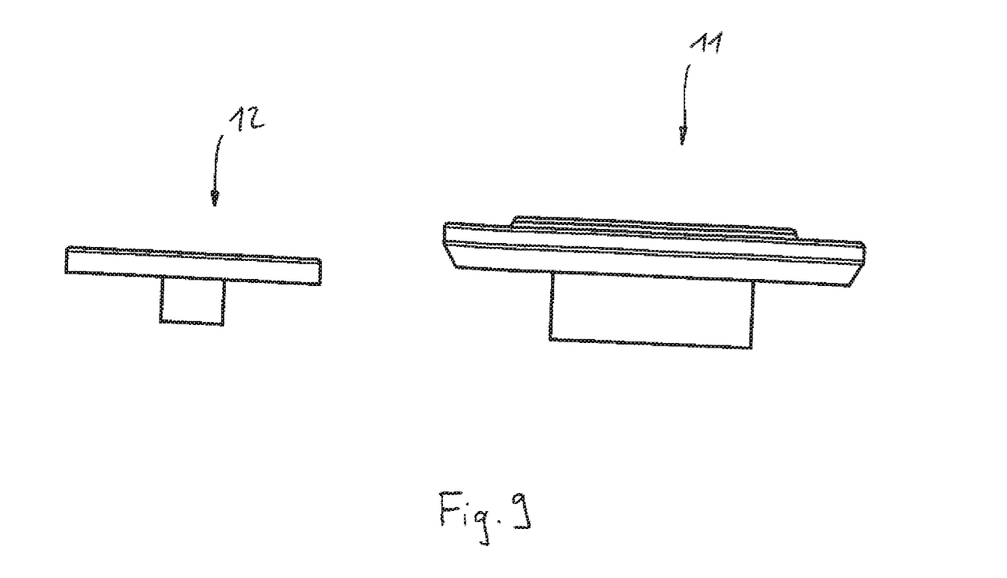
FIG. 9 shows the actuating elements in accordance with FIG. 5 in the demounted state in a lateral view.
Figure 10:
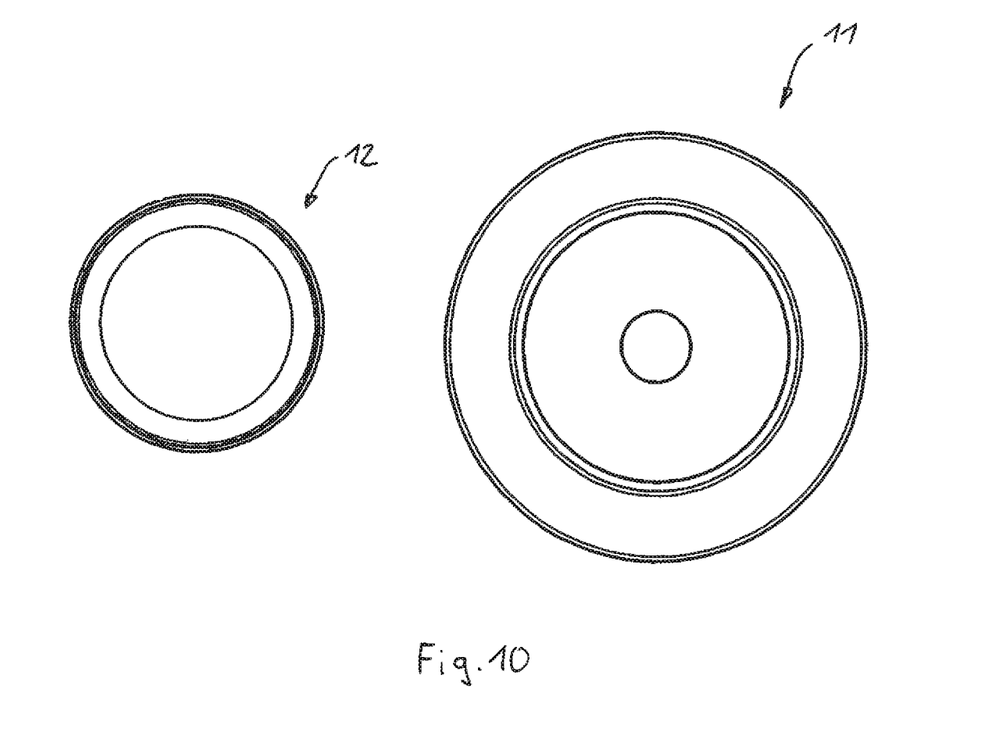
FIG. 10 shows the actuating elements in accordance with FIG. 5 in the demounted state in a view from above.

FIG. 9 and FIG. 10 show the rotary disk 12 and the rotary swivel 11 in the demounted state in a lateral view and in a view from above, respectively.

The invention claimed is:

1. A lighting control console for controlling a lighting system, digital adjusting commands being generated in the lighting control console, which commands are transmitted to the lighting devices of the lighting system via data links, and said lighting control console comprising at least one digital processor and at least one digital memory for generating, managing and storing the adjusting commands, and said lighting control console comprising at least one display device, and said display device being configured to graphically depict graphic elements for users,
wherein
at least one dual encoder is provided in the control panel of the lighting control console, which dual encoder allows users to enter input values, wherein the dual encoder presents a first shaft being mounted in a housing so as to be rotatable, and wherein a first rotation signal generator, for generating a data signal, is provided at the first shaft, and wherein a second shaft being mounted in the housing so as to be coaxially rotatable is provided at the dual encoder, and wherein a second rotation signal generator for generating a data signal is provided at the second shaft, and wherein both shafts present actuating elements, at which adjusting movements are transmitted onto the shafts by hand, and wherein the actuating elements, for hand-actuated adjustment of the shafts, are embodied in the manner of a rotary disk and/or of a rotary swivel disposed in the control panel-of the lighting control console and configured to be coaxially turned in opposite directions.

2. The lighting control console according to claim 1, wherein a first locking mechanism, for locking different rotational positions of the first shaft, is provided at the first shaft, wherein the first rotation signal generator is provided for generating a data signal showing a switchover between two locking positions, and wherein a second locking mechanism for locking different rotational positions of the second shaft is provided at the second shaft, and wherein the second rotation signal generator is provided for generating a data signal showing a switchover between two locking positions.

3. The lighting control console according to claim 1, wherein the upper side of the rotary disks or of the rotary swivel is embodied in the manner of a fingertip contact surface, wherein the rotary disk or the rotary swivel is rotationally driven by way of the engagement of a fingertip at the fingertip contact surface.

4. The lighting control console according to claim 3, wherein the fingertip contact surface is concave.

5. The lighting control console according to claim 3 wherein the fingertip contact surface presents an annular shape or in that the fingertip contract surface presents a circular shape.

6. The lighting control console according to claim 3, wherein the first fingertip contact surface of the rotary disks or of the rotary swivel, with the aid of which the first shaft is driven, and the second fingertip contact surface of the rotary disks or of the rotary swivel, with the aid of which the second shaft is driven, are disposed on the same level in relation to the outside of the housing of the lighting control console.

7. The lighting control console according to claim 1, wherein at least one shaft is mounted in the housing so as to be axially adjustable in the direction of its longitudinal axis between a rest position and a switched position, wherein a switching sensor is provided in the housing, with the aid of which sensor the rest position and/or the switched position of the axially adjustable shaft are/is detected, wherein the function of a rotation signal generator is switched as a function of the actuation of the push button.

8. The lighting control console according to claim 1 wherein a push button is disposed directly next to the rotary disk and/or to the rotary swivel, wherein a switching sensor is provided in the housing, with the aid of which sensor the rest position and/or the switched position of the push button are/is detected.

9. The lighting control console according to claim 1 wherein the lighting control console comprises at least two housings that are linked to each other with the aid of a data interface, wherein the dual encoder is provided at the first housing, and wherein the second housing comprises the digital processor and at least one digital memory for generating, managing and storing adjusting commands.

10. The lighting control console according to claim 9, wherein the second housing or a third housing that is linked to the second housing with the aid of a data interface comprises the display device, and wherein graphic elements are graphically depicted for users at the display device.

11. The lighting control console according to claim 10, wherein the second housing is embodied in the manner of a laptop or of a personal computer.

* * * * *